(12) United States Patent
Divsalar et al.

(10) Patent No.: US 7,716,552 B2
(45) Date of Patent: *May 11, 2010

(54) INTERLEAVED SERIAL CONCATENATION FORMING TURBO-LIKE CODES

(75) Inventors: Dariush Divsalar, Pacific Palisades, CA (US); Robert J. McEliece, Pasadena, CA (US); Hui Jin, Glen Gardner, NJ (US); Fabrizio Pollara, Lacanada, CA (US)

(73) Assignee: California Institute of Technology, Pasadena, CA (US)

( * ) Notice: Subject to any disclaimer, the term of this patent is extended or adjusted under 35 U.S.C. 154(b) by 504 days.

This patent is subject to a terminal disclaimer.

(21) Appl. No.: 11/429,083

(22) Filed: May 5, 2006

(65) Prior Publication Data

US 2006/0218460 A1    Sep. 28, 2006

Related U.S. Application Data

(63) Continuation of application No. 09/922,852, filed on Aug. 18, 2000, now Pat. No. 7,089,477.

(60) Provisional application No. 60/149,871, filed on Aug. 18, 1999.

(51) Int. Cl.
*H03M 13/29* (2006.01)
*H03M 13/45* (2006.01)

(52) U.S. Cl. .................. 714/755; 714/780; 714/786

(58) Field of Classification Search ................ 714/755
See application file for complete search history.

(56) References Cited

U.S. PATENT DOCUMENTS

| 5,392,299 | A | 2/1995 | Rhines et al. |
| 5,751,739 | A | 5/1998 | Seshadri et al. |
| 5,881,093 | A | 3/1999 | Wang et al. |
| 6,014,411 | A | 1/2000 | Wang |
| 6,023,783 | A | 2/2000 | Divsalar et al. |
| 6,031,874 | A | 2/2000 | Chennakeshu et al. |
| 6,032,284 | A | 2/2000 | Bliss |
| 6,437,714 | B1 | 8/2002 | Kim et al. |
| 6,810,502 | B2 | 10/2004 | Eidson et al. |

OTHER PUBLICATIONS

Benedetto, S., et al., "Analysis, Design, and Iterative Decoding of Double Serially Concatenated Codes with Interleavers", IEEE Journal on Selected Areas in Communications, vol. 16, No. 2, Feb. 1998, pp. 231-234.*

Wiberg et al., "Codes and Iterative Decoding on General Graphs", 1995 Intl. Symposium on Information Theory, Sep. 1995, p. 506.

Divsalar, D., et al. "Multiple Turbo Codes for Deep-Space Communications" The Telecommunications and Data Acquisition Progress Report 42-121 for NASA and California Institute of Technology Jet Propulsion Laboratory, Joseph H. Yuen, ed.,pp. 60-77, May 15, 1995.

(Continued)

*Primary Examiner*—Stephen M Baker (57) ABSTRACT

A turbo-like code is formed by repeating the signal, coding it, and interleaving it. A serial concatenated coder is formed of an inner coder and an outer coder separated by an interleaver. The outer coder is a coder which has rate greater than one e.g. a repetition coder. The interleaver rearranges the bits. An outer coder is a rate one coder.

44 Claims, 6 Drawing Sheets

OTHER PUBLICATIONS

Divsalar, D., et al. "On the Design of Turbo Codes" The Telecommunications and Data Acquisition Progress Report 42-123 for NASA and California Institute of Technology Jet Propulsion Laboratory, Joseph H. Yuen, ed.,pp. 99-121, Nov. 15, 1995.

Divsalar, D., et al., "Low-Rate Turbo Codes for Deep Space Communications" Proceedings from the 1995 IEEE International Symposium on Information Theory, Whistler, British Columbia, Canada, pp. 35, Sep. 17-22, 1995.

Benedetto, S., et al., "Bandwidth efficient parallel concatenated coding schemes" Electronics Letters, vol. 31, No. 24, pp. 2067-2069, Nov. 23, 1995.

Divsalar, D., et al., "Turbo Codes for PCS Applications" IEEE ICC 95, Seattle, WA, pp. 54-59, Jun. 1995.

Divsalar, D., et al., "Multiple Turbo Codes" MILCOM 95, San Diego, CA, pp. 279-285, Nov. 5-6, 1995.

Benedetto, S., et al. "Soft-Output Decoding Algorithms in Iterative Decoding of Turbo Codes" The Telecommunications and Data Acquisition Progress Report 42-124 for NASA and California Institute of Technology Jet Propulsion Laboratory, Joseph H. Yuen, ed.,pp. 63-87, Feb. 15, 1996.

Divsalar, D., et al., "Effective free distance of turbo codes" Electronic Letters, vol. 32, No. 5, pp. 445-446, Feb. 29, 1996.

Benedetto, S., et al. "Serial Concatenation of Interleaved Codes: Performance Analysis, Design, and Iterative Decoding" The Telecommunications and Data Acquisition Progress Report 42-126 for NASA and California Institute of Technology Jet Propulsion Laboratory, Joseph H. Yuen, ed.,pp. 1-26, Aug. 15, 1996.

Benedetto, S., et al. "A Soft-Input Soft-Output Maximum A Posteriori (MAP) Module to Decode Parallel and Serial Concatenated Codes" The Telecommunications and Data Acquisition Progress Report 42-127 for NASA and California Institute of Technology Jet Propulsion Laboratory, Joseph H. Yuen, ed.,pp. 1-20, Nov. 15, 1996.

Benedetto, S., et al., "Parallel Concatenated Trellis Coded Modulation" ICC 96, pp. 974-978, Jun. 1996.

Benedetto, S., et al., "A Soft-Input Soft-Output APP Module for Iterative Decoding of Concatenated Codes" IEEE Communication Letters, vol. 1, No. 1, pp. 22-24, Jan. 1997.

Divsalar, D., et al., "Hybrid Concatenated Codes and Iterative Decoding" Proceedings from the IEEE 1997 International Symposium on Information Theory, Ulm, Germany, p. 10, Jun. 29-Jul. 4, 1997.

Benedetto, S., et al., "Serial Concatenation of interleaved codes: performance analysis, design, and iterative decoding" Proceedings from the IEEE 1997 International Symposium on Information Theory, Ulm, Germany, p. 106, Jun. 29-Jul. 4, 1997.

Benedetto, S., et al., "Design of Serially Concatenated Interleaved Codes" ICC 97, Montreal, Canada, pp. 710-714, Jun. 1997.

Benedetto, S., et al., "Serial Concatenation Trellis Coded Modulation with Iterative Decoding", Proceedings from the IEEE 1997 Intranational Symposium on Information Theory, Ulm, Germany, p. 8 Jun. 29-Jul. 4, 1997.

\* cited by examiner

INTERLEAVED SERIAL CONCATENATION FORMING TURBO-LIKE CODES

CROSS-REFERENCE TO RELATED APPLICATIONS

This application is a continuation of U.S. application Ser. No. 09/922,852, filed Aug. 18, 2000 now U.S. Pat. No. 7,089,477, which claims the benefit of U.S. Provisional Application No. 60/149,871, filed Aug. 18, 1999.

The work described herein may have been supported by Grant Nos. NCR 9505975, awarded by the National Science Foundation, and 5F49620-97-1-0313 awarded by the Air Force. The US Government may have certain rights to this invention.

BACKGROUND

Properties of a channel affect the amount of data that can be handled by the channel. The so-called "Shannon limit" defines the theoretical limit on the amount of data that a channel can carry.

Different techniques have been used to increase the data rate that can be handled by a channel. "Near Shannon Limit Error-Correcting Coding and Decoding: Turbo Codes," by Berrou et al. ICC, pp 1064-1070, (1993), described a new "turbo code" technique that has revolutionized the field of error correcting codes.

Turbo codes have sufficient randomness to allow reliable communication over the channel at a high data rate near capacity. However, they still retain sufficient structure to allow practical encoding and decoding algorithms. Still, the technique for encoding and decoding turbo codes can be relatively complex.

Figure 1:
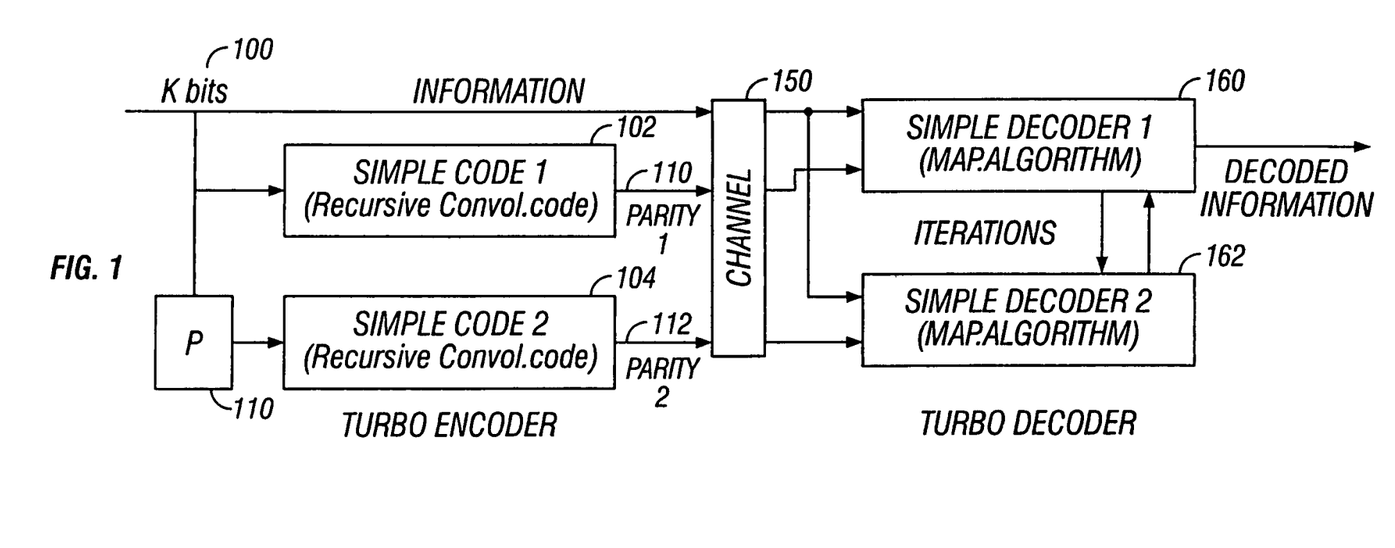
FIG. 1 shows a prior "turbo code" system.

A standard turbo coder is shown in FIG. 1. A block of k information bits 100 is input directly to a first encoder 102. A k bit interleaver 110 also receives the k bits and interleaves them prior to applying them to a second encoder 104. The second encoder produces an output that has more bits than its input, that is, it is a coder with a rate that is less than 1.

The encoders 102, 104 are also typically recursive convolutional coders.

Three different items are sent over the channel 150: the original k bits 100, first encoded bits 110, and second encoded bits 112.

At the decoding end, two decoders are used: a first constituent decoder 160 and a second constituent decoder 162. Each receives both the original k bits, and one of the encoded portions 110, 112. Each decoder sends likelihood estimates of the decoded bits to the other decoder. The estimates are used to decode the uncoded information bits as corrupted by the noisy channel.

SUMMARY

The present application describes a new class of codes, coders and decoders: called "turbo-like" codes, coders and decoders. These coders may be less complex to implement than standard turbo coders.

The inner coder of this system is rate 1 encoder, or a coder that encodes at close to rate 1. This means that this coder puts out a similar number of bits to the number it takes in. Fewer bits are produced as compared with other systems that use rate less than 1 as their inner coder.

The system can also use component codes in a serially concatenated system. The individual component codes forming the overall code may be simpler than previous codes. Each simple code individually might be considered useless.

More specifically, the present system uses an outer coder, an interleaver, and inner coder. Optional components include a middle coder 305, where the middle coder can also include additional interleavers.

The inner coder is a linear rate 1 coder, or a coder whose rate is close to 1.

Unlike turbo coders that produce excess information in their final coder, the present system uses a final coder which does not increase the number of bits. More specifically, however, the inner coder can be one of many different kinds of elements.

DETAILED DESCRIPTION

Figure 2:
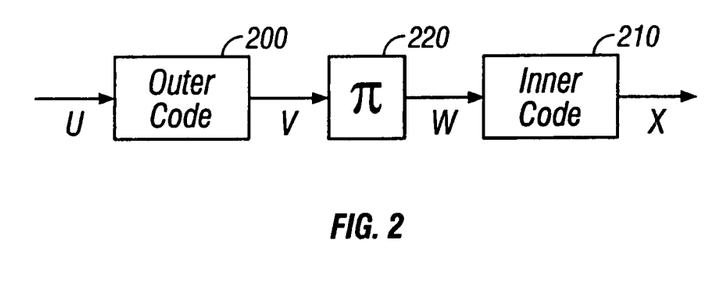
FIG. 2 shows a generic turbo-like coder in its most general form with a single rate 1 inner coder, single outer coder, and a single interleaver.

An embodiment of the present system, in its most general form, is shown in FIG. 2. In general, this system has two encoders: an outer coder 200 and an inner coder 210 separated by an interleaver 220.

Encoder 200 is called an outer encoder, and receives the uncoded data. The outer coder can be an (n,k) binary linear encoder where n>k. This means that the encoder 200 accepts as input a block u of k data bits. It produces an output block v of n data bits. The mathematical relationship between u and v is $v=T_0 u$, where $T_0$ is an n×k binary matrix. In its simplest form, the outer coder may be a repetition coder. The outer coder codes data with a rate that is less than 1, and may be, for example, ½ or ⅓.

The interleaver 220 performs a fixed pseudo-random permutation of the block v, yielding a block w having the same length as v. The permutation can be an identity matrix, where the output becomes identically the same as the input. Alternately and more preferably, the permutation rearranges the bits in a specified way.

The inner encoder 210 is a linear rate 1 encoder, which means that the n-bit output block x can be written as $x=T_I w$, where $T_I$ is a nonsingular n×n matrix. Encoder 210 can have a rate that is close to 1, e.g., within 50%, more preferably 10% and perhaps even more preferably within 1% of 1.

Figure 8:
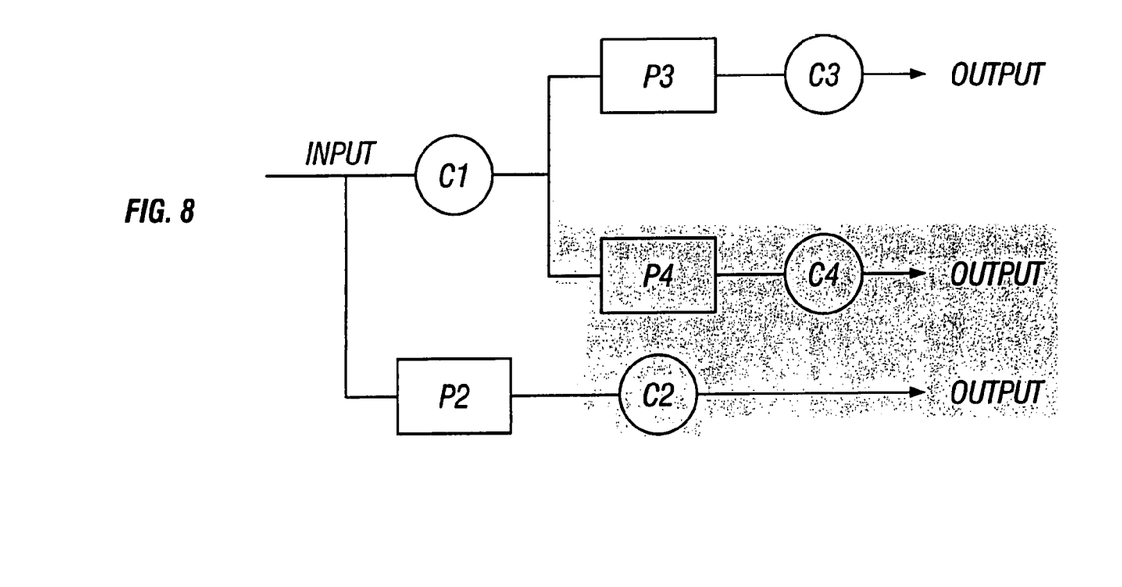
FIG. 8 shows a tree structure with a second branch.

The overall structure of coders such as the one in FIG. 8 has no loops, i.e., it is not "recursive" between coders. The whole operation proceeds by a graph theoretic tree. A tree structure can simplify the overall operation.

A number of different embodiments will be described herein, all of which follow the general structure of FIG. 2 which includes the first outer coder 200 (rate <1), which can be an encoder for a binary (n,k) linear block code; a pseudo random interleaver 220 which receives the output (rate 1), and a rate 1 inner coder 210 that codes the interleaved output.

Figure 3:
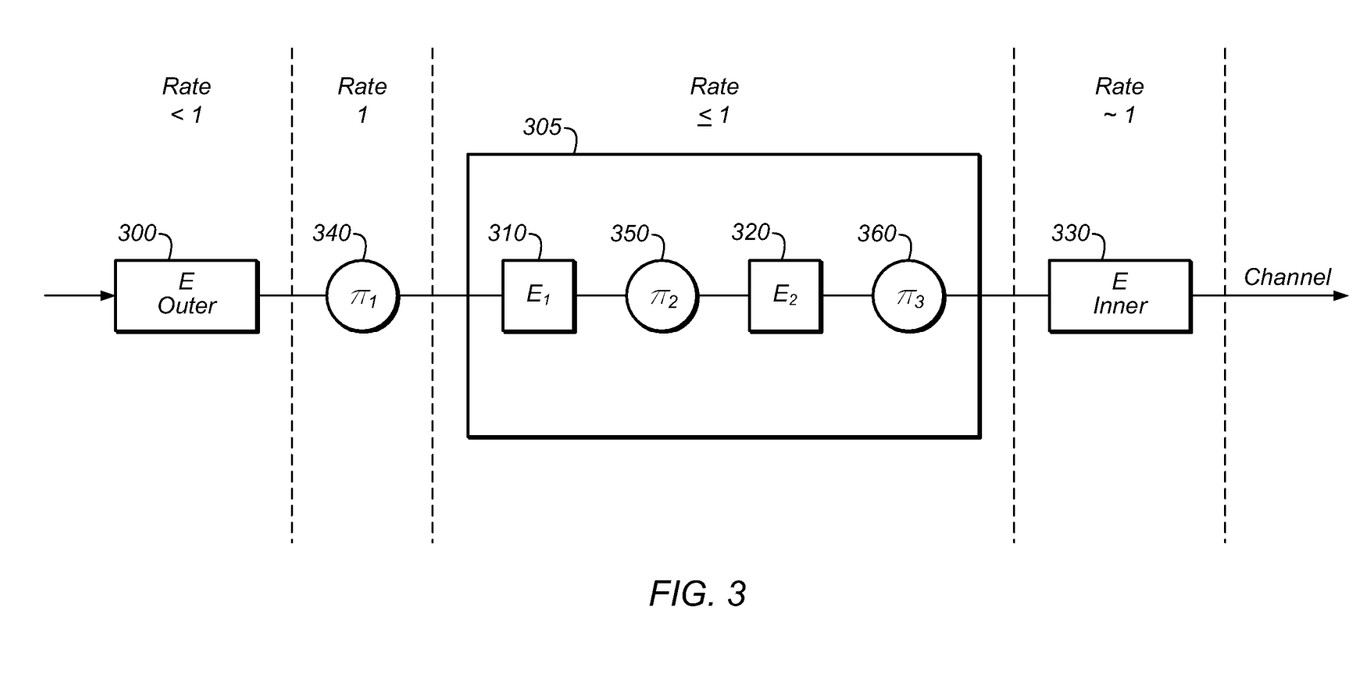
FIG. 3 shows a x=4 coder.

More generally, there can be more than 2 encoders: there can be x encoders, and x−1 interleavers. The additional coder can be generically shown as a middle coder. FIG. 3 shows four encoders 300, 310, 320, 330. Three of these coders; here 310, 320, 330; are rate 1 encoders. The outer encoder 300 is an (n,k) linear block coding encoder. Three pseudorandom interleavers 340, 350, 360 separate the rate 1 coders from the outer coder 300. The middle coder, in general, has a rate less than or equal to 1.

A number of embodiments of the coders are described including a repeat and accumulate ("RA") coder, a repeat double accumulate ("RDD") coder and a repeat accumulate accumulate ("RAA") coder.

The RA coder includes an outer coder and an inner coder connected via a pseudorandom interleaver. The outer code uses a simple repetition code, and the inner code is a rate 1 accumulator code. The accumulator code is a truncated rate 1 convolutional code with transfer function 1/(1+D). Further details are provided in the following.

Figure 4:
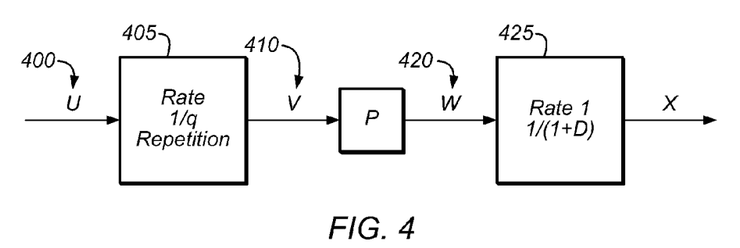
FIGS. 4 and 5 show a repeat and accumulate coder.
Figure 5:
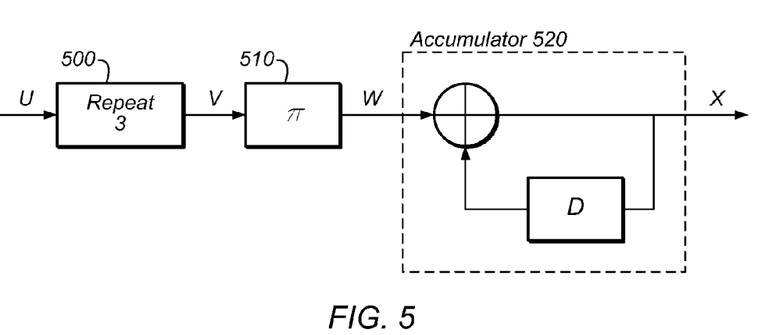

FIGS. 4 and 5 show two versions of encoder systems for the basic repeat and accumulate code, using the general structure described above. An information block 400 of length k is input to the outer coder 405, here a rate 1/q repetition element. The device 405 replicates the input block q times to produce an information block 410 of length qk. The replication may be carried out a subblock at a time. Information 410 is then interleaved by a qk×qk permutation matrix to form information block of length qk 420. This block is then encoded by an accumulator 425. In FIG. 5, this accumulator 520 is a truncated rate 1 recursive convolutional coder with transfer function 1/(1+D). Looking at this accumulator mathematically, it can be seen as a block code whose input block $\{x_1, \ldots, x_n\}$ and output block $\{y_1, \ldots, y_n\}$ are related by the formula $y_1 = x_1$ $y_1 = x_1$
$y_2 = x_1 \oplus x_2$
$y_3 = x_1 \oplus x_2 \oplus x_3$
$\vdots$
$y_n = x_1 \oplus x_2 \oplus x_3 \oplus \ldots \oplus x_n$ In the q=3 embodiment of the encoder, a block of k data bits (u[1], u[2], ..., u[k]), (the u-block) is subjected to a three-stage process which produces a block of 3k encoded bits (x[1], x[2], ..., x[3k]) (the x-block). This process is depicted in FIG. 5.

Stage 1 of the encoding process forms the outer encoder stage. This system uses a repetition code. The input "u" block (u[1], ..., u[k]) is transformed into a 3k-bit data block (v[1], v[2], ..., v[3k]) (the v-block). This is done by repeating each data bit 3 times, according to the following rule:

$v[1] = v[2] = v[3] = u[1]$
$v[4] = v[5] = v[6] = u[2]$
$\vdots \quad \vdots$
$v[3k-2] = v[3k-1] = u[3k] = u[k].$ Stage 2 of the encoding process is the interleaver 510. The interleaver converts the v-block into the w-block as follows:

$w[1] = v[\pi[1]]$
$w[2] = v[\pi[2]]$
$\vdots$
$w[3k] = v[\pi[3k]],$ and $\pi[1], \pi[2], \ldots, \pi[3k]$ is a fixed permutation of the set $\{1, 2, \ldots, kq\}$ for this case of q=3.

Stage 3 of the encoding process is the accumulator 520. This converts the w-block into the x-block by the following rule:

$x[1] = w[1]$
$x[2] = x[1] \oplus w[2]$
$x[3] = x[2] \oplus w[3]$
$\vdots$
$x[kq] = x[kq-1] \oplus w[kq],$ Where "⊕" denotes modulo two, or exclusive or, addition. An advantage of this system is that only mod 2 addition is necessary for the accumulator. That means that the accumulator can be embodied using only exclusive or (xor) gates. This can simplify the design.

The accumulator 520 can alternatively be represented as a digital filter with transfer function equal to 1/(1+D) as shown in 425.

The RA coder is a 1/q coder, and hence can only provide certain rates, e.g. ½, ⅓, ¼, ⅕, etc. Other variations of this general system form alternative embodiments that can improve performance and provide flexibility in the desired rate.

Figure 6:
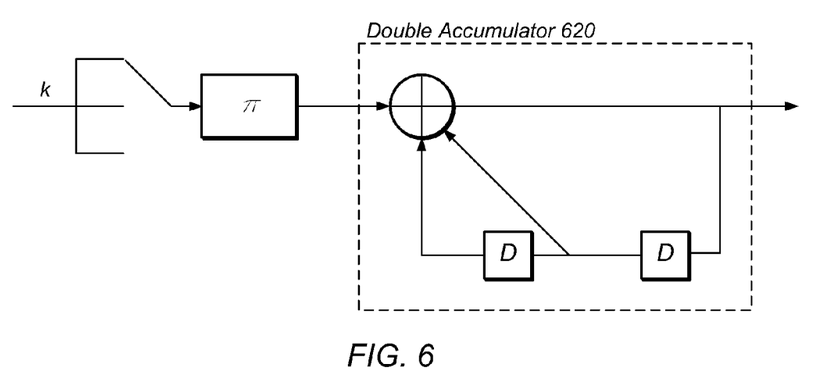
FIG. 6 shows a repeat/double accumulator coder.

One such is the "RDD" code. The encoder for RDD is shown in FIG. 6. The accumulator component of the RA code is replaced by a "double accumulator 620." The double accumulator can be viewed as a truncated rate 1 convolutional code with transfer function $1/(1+D+D^2)$.

Figure 7:
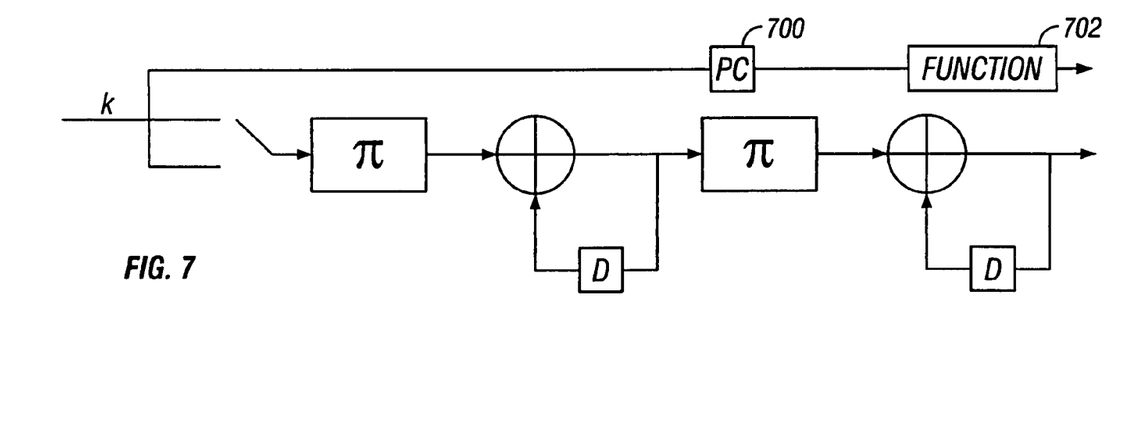
FIG. 7 shows a dual accumulator system.

In another preferred embodiment shown in FIG. 7, called the "RAA" code, there are three component codes: The "outer" code, the "middle" code, and the "inner" code. The outer code is a repetition code, and the middle and inner codes are both accumulators. The outer code has rate less than 1, the middle code and the inner code are both accumulators (of rate 1) and the inner code has a rate which is 1 or close to 1.

As described above, the "repetition number" q of the first stage of the encoder can be any positive integer greater than or equal to 2. The outer encoder is the encoder for the (q, 1) repetition code.

The outer encoder can carry out coding using coding schemes other than simple repetition. In the most general embodiment, the outer encoder is a (q, k) block code. For example, if k is a multiple of 4, the input block can be partitioned into four bit subblocks, and each 4-bit subblock can be encoded into 8 bits using an encoder for the (8,4) extended Hamming code. Any other short block code can be used in a similar fashion, for example a (23, 12) Golay code.

In general, k can be partitioned into subblocks $k_1, k_2, \ldots, k_m$ such that $$\sum_{i=1}^{m} k_i = k.$$

q can be similarly partitioned. Thus, the k input bits can be encoded by m block codes $(q_i, k_i)$ for any i. In general, these outer codes can be different. Truncated convolutional codes can be used as the block codes. Repetition codes can also be used as the block codes.

In a similar fashion, the q output bits of the interleaver can be partitioned into j subblocks $q'_1, q'_2 \ldots$ such that the summation of all the $q'_j = q$. Then each subblock can be encoded with a rate 1 inner code. In general these inner codes can be different recursive rate 1 convolutional codes:

The accumulator 520 in stage 3 of the encoder can be replaced by a more general device, for example, an arbitrary digital filter using modulo 2 arithmetic with infinite impulse response ("i.i.r.") FIG. 6 shows, for example, the accumulator being an i.i.r. filter with whose transfer function is $1/(1+D+D^2)$.

The system can be a straight tree, or a tree with multiple branches. FIG. 8 shows a multiple branch tree, where the outer encoder c1 feeds two interleavers p3, p4, each of which is associated with a rate 1 inner coder c3, c4. A totally separate branch has the interleaver p2, and rate 1 inner coder c2.

Some or all of the output bits from the outer encoder can be sent directly to the channel and/or to a modulator for the channel.

Any of a number of different techniques can be used for decoding such a code. For example, soft input soft output can be used with a posteriori probability calculations to decode the code.

A specific described decoding scheme relies on exploiting the Tanner Graph representation of an RA code.

Figure 9:
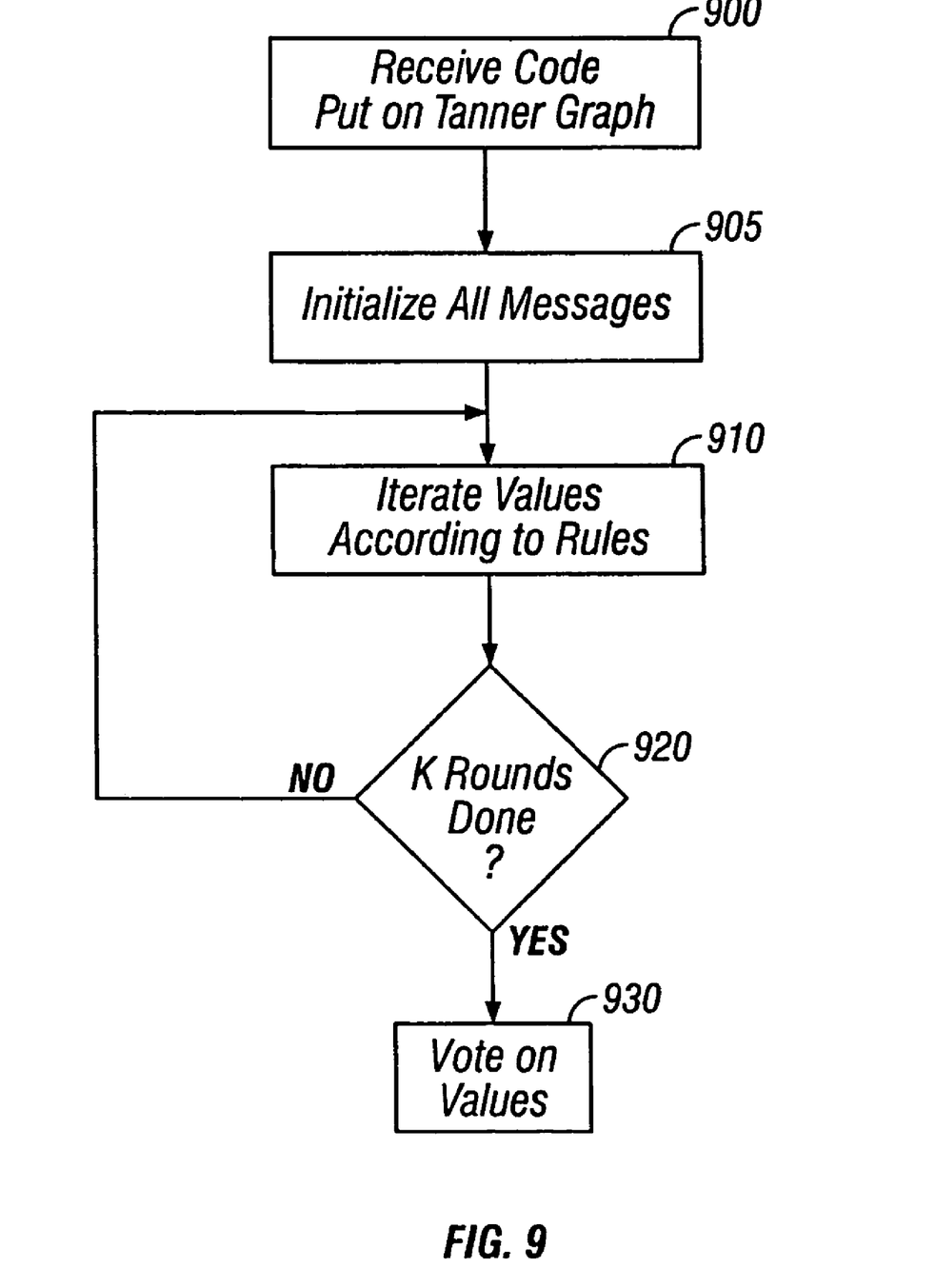
FIG. 9 shows a flow chart of Tanner Graph decoding.

FIG. 9 shows a flowchart of operation. The code is received, and a Tanner Graph is used to describe the essential structure of the code on a graph at 900.

Roughly speaking, a Tanner Graph $G=(V,E)$ is a bipartite graph whose vertices can be partitioned into variable nodes $V_m$ and check nodes $V_c$, where edges $E \subseteq V_m \times V_c$. Check nodes in the Tanner Graph represent certain "local constraints" on a subset of variable nodes. An edge indicates that a particular variable is present in a particular constraint.

The Tanner Graph realization for an RA code is explained with reference to FIG. 10. For a repetition q type RA code with block length k, the k information bits can be denoted by $u_i$, $i=1, 2, \ldots n$, the qk code bits by $y_i$, and the intermediate bits (which are the outputs of the outer code and the inputs to the inner code) by $x_i$. $y_i$ and $x_i$ are related by the formula $$y_i = \begin{cases} x_i & \text{if } i = 1, \\ x_i + y_{i-1} & \text{otherwise.} \end{cases}$$

Notice that every $x_i$ is a replica of some $u_j$. Therefore, all qk equations in the above can be represented by check nodes $c_i$. These check nodes represent both information bits $u_i$ and code bits $y_i$ by variable nodes with the same symbol.

Edges can be naturally generated by connecting each check node to the $u_i$ and $y_i$s that are present in its equation. Using notation $C=\{c_i\}$, $U=\{u_i\}$ $Y=\{y_i\}$ provides a Tanner Graph representation of an RA code, with $V_m = U \cup Y$ and $V_c = C$.

Figure 10:
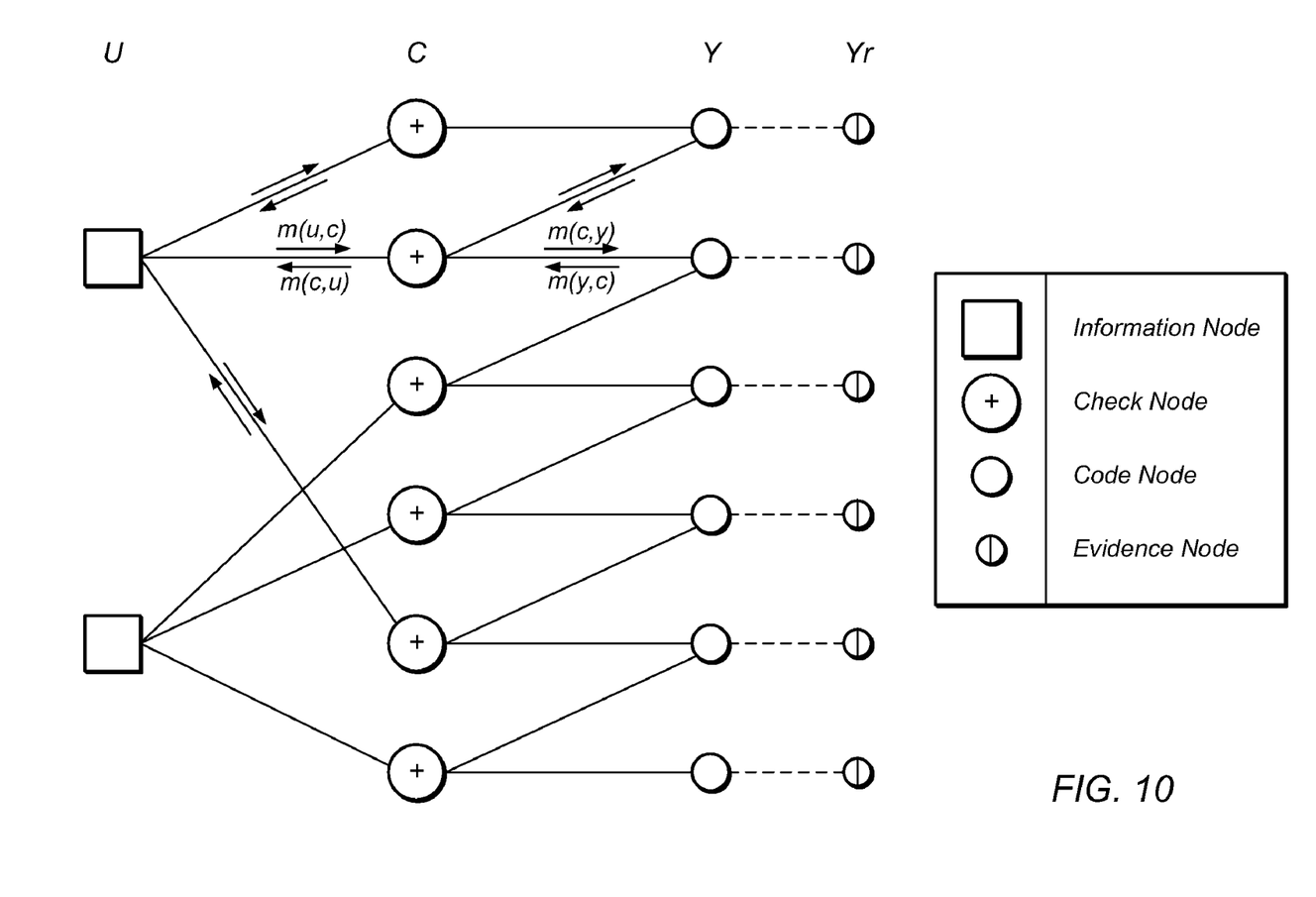
FIG. 10 shows the actual Tanner Graph decoding.

FIG. 10 shows such a Tanner Graph specifically for a q=3, k=2 (repetition 3 block length 2) RA code, with permutation $\pi=(1, 2, 5, 3, 4, 6)$. This graph also shows the received version of code bits y through the channel, which are denoted by $y_r$. Although the received bits $y_r$ may provide evidence or confirmation in the decoding procedure, they are not strictly part of the Tanner Graph.

Generally, in the Tanner Graph for a repetition q RA code, every $u_i$ is present in q check nodes regardless of the block-length k. Hence every vertex $u \in U$ has degree q. Similarly, every vertex $c \in C$ has degree 3 (except the first vertex $c_1$ which has degree 2), and every vertex $y \in Y$ has degree 2 (except the last vertex $y_{qk}$, which has degree 1.

"Belief propagation" on the Tanner Graph realization is used to decode RA codes at 910. Roughly speaking, the belief propagation decoding technique allows the messages passed on an edge e to represent posterior densities on the bit associated with the variable node. A probability density on a bit is a pair of non-negative real numbers $p_o$, $p_1$ satisfying $p_o+P_1=1$, where $p_o$ denotes the probability of the bit being 0, $p_1$ the probability of it being 1. Such a pair can be represented by its log likelihood ratio log $$\frac{p_1}{p_o}.$$

It can be assumed that the messages here use this representation.

There are four distinct classes of messages in the belief propagation decoding of RA codes, namely messages sent (received) by some vertex $u \in U$ to (from) some vertex $c \in C$, which are denoted by m[u,c] (m[c,u]), and messages sent (received) by some vertex $y \in Y$ to (from) some vertex $c \in C$, which are denoted by m[y,c] (m[c,y]). Messages are passed along the edges, as shown in FIG. 10. Both m[u,c] and m[c,u] have the conditional value of log $$\frac{p(u=1)}{p(u=0)},$$

both m[y,c] and m[c,y] have the conditional value of log $$\frac{p(y=1)}{p(y=0)}.$$

Each code node of y also has the belief provided by received bit $y_r$, which value is denoted by $$B(y) = \log \frac{p(y=1/y_r)}{p(y=0/y_r)}.$$

With all the notations introduced, the belief propagation decoding of an RA code can be described as follows:

Initialize all messages m[u,c], m[c,u], m[y,c], m[c,y] to be zero at 905. Then iterate at 910. The messages are continually updated over K rounds at 920 (the number K is predetermined or is determined dynamically by some halting rule during execution of the algorithm). Each round is a sequential execution of the following script:

Update m[y,c]:

$$m[y, c] = \begin{cases} B(y) & \text{if } y = y_{qk}, \\ B(y) + m[c', y] & \text{otherwise, where} \\ & (c', y) \in E \text{ and } c' \neq c. \end{cases}$$

Update m[c,u]:

$$m[c, u] = \begin{cases} m[y, c] & \text{if } c = c_1, \text{ where} \\ & (y, c) \in E \text{ and } y \in Y, \\ \log \frac{e^{m[y,c]} + e^{m[y',c]}}{1 + e^{m[y,c]+m[y',c]}} & \text{otherwise, where}(y, c), \\ & (y', c) \in E \text{ and } y \neq y' \in Y. \end{cases}$$

Update m[u,c]:

$m[u,c] = \Sigma_{c'} m[u,c']$, where $(u,c') \in E$ and $c' \neq c$.

Update m[c,y]:

$$m[c, y] = \begin{cases} m[u, c] \\ \log \dfrac{e^{m[u,c]} + e^{m[y',c]}}{1 + e^{m[u,c]+m[y',c]}} \end{cases}$$

if $c=c_1$, where $(u, c) \in E$ and $u \in U$, otherwise, where $(u, c)$, $(y',c) \in$ and $y \neq y' \in Y$.

Upon completion of the K iterative propagations, the values are calculated based on votes at 930. Specifically, compute $$S_u = \sum_c m[u, c]$$

for every $u \in U$, where the summation is over all the c such that $(u,c) \in E$. If $s(u) >= 0$, bit u is decoded to be 1; otherwise, it is decoded to be 0.

Although only a few embodiments have been disclosed herein, other modifications are possible. For example, the inner coder is described as being close to rate 1. If the rate of the inner coder is less than one, certain bits can be punctured to increase the code rate.

What is claimed is:

1. A method comprising:
   a first encoder performing an outer encoding on a block of input bits to produce outer encoded bits, wherein said outer encoding has a rate less than one;
   an intermediate device operating on said outer encoded bits to generate intermediate bits, wherein said operating on said outer encoded bits includes interleaving the outer encoded bits; and
   a second encoder performing an inner encoding on said intermediate bits, wherein the inner encoding is performed according to a first rate-1 convolutional code having a transfer function equal to 1/(1+D).

2. The method of claim 1, wherein said performing the outer encoding includes repeating each bit of said block of input bits q times, where q is an integer greater than one.

3. The method of claim 1, wherein the second encoder includes an XOR gate and a delay element.

4. The method of claim 1, wherein said performing the outer encoding includes operating on subblocks of said block of input bits with corresponding subcodes.

5. The method of claim 4, wherein the subcodes are truncated convolutional codes.

6. The method of claim 1, wherein said operating on said outer encoded bits also includes:
   performing a first encoding on bits resulting from said interleaving of the outer encoded bits to generate first encoded bits, wherein said first encoding is performed according to a second rate-1 convolutional code; and
   interleaving the first encoded bits to generate the intermediate bits.

7. The method of claim 6, wherein the second rate-1 convolutional code has a transfer function equal to 1/(1+D).

8. A system comprising:
   an outer encoder having a rate less than one and configured to generate outer encoded bits by operating on a block of input bits;
   an interleaver subsystem configured to operate on said outer encoded bits to generate intermediate bits, wherein said operating on said outer encoded bits includes interleaving the outer encoded bits; and
   an inner encoder configured to operate on the intermediate bits according to a first rate-1 convolutional code having a transfer function equal to 1/(1+D).

9. The system of claim 8, wherein said operating on the block of input bits includes repeating each bit of said block of input bits q times, where q is an integer greater than one.

10. The system of claim 8, wherein the inner encoder includes an XOR gate and a delay element.

11. The system of claim 8, wherein said operating on the block of input bits includes operating on subblocks of said block of input bits with corresponding subcodes.

12. The system of claim 11, wherein the subcodes are truncated convolutional codes.

13. The system of claim 8, wherein the interleaver subsystem includes a first interleaver, a first encoder and a second interleaver, wherein the first interleaver is configured to perform said interleaving of the outer encoded bits to generate interleaved bits, wherein the first encoder is configured to perform an encoding on said interleaved bits to generate first encoded bits according to a second rate-1 convolutional code, wherein the second interleaver is configured to perform an interleaving on said first encoded bits.

14. The system of claim 13, wherein the second rate-1 convolutional code has a transfer function equal to 1/(1+D).

15. A system comprising:
   a plurality of encoders; and
   one or more interleavers;
   wherein the plurality of encoders and the one or more interleavers are interconnected in a tree structure;
   wherein the plurality of encoders includes an outer encoder configured to receive input data of the system, wherein the outer encoder has a rate less than one;
   wherein the plurality of encoders also includes one or more inner encoders that generate output data of the system;
   wherein each of the inner encoders couples to exactly one of the interleavers, wherein the outer encoder is coupled to a first of the inner encoders through at least one of the interleavers, wherein each of the inner encoders encodes according to a corresponding rate-1 convolutional code having infinite impulse response, wherein at least one of the inner encoders has a transfer function equal to 1/(1+D) or 1/(1+D+D$^2$).

16. The system of claim 15, where at least one of the interleavers is configured to receive the input data of the system.

17. The system of claim 15, wherein the outer encoder is coupled to a second of the inner encoders through at least one of the interleavers.

18. A method for decoding information, the method comprising:
   a device receiving input information from a channel, wherein the input information corresponds to encoded output bits generated by an encoder, wherein the encoder has a structure including:
     an outer encoder with a rate less than one configured to generate outer encoded bits by operating on a block of input bits;
     an interleaver subsystem configured to operate on said outer encoded bits in order to generate intermediate bits, wherein said operating on said outer encoded bits includes interleaving the outer encoded bits; and
     an inner encoder configured to operate on the intermediate bits according to a first rate-1 convolutional code having a transfer function equal to 1/(1D) in order to produce said encoded output bits;

the device performing an iterative decoding algorithm to determine soft output information using the received input information, wherein said iterative decoding algorithm relies on information characterizing relationships between variables including first variables that correspond to the input bits and second variables that corresponding to the encoded output bits, wherein said relationships are determined at least in part by said structure of the encoder;

the device determining estimates of the input bits based on the soft output information.

19. The method of claim 18, wherein said performing said iterative decoding algorithm includes terminating said iterative decoding algorithm when a termination condition is achieved.

20. The method of claim 18, wherein the iterative decoding algorithm includes the belief propagation algorithm.

21. The method of claim 18, wherein the input information includes samples of an analog signal, wherein the soft output information includes a plurality of values, wherein said determining estimates of the input bits based on the soft output information includes comparing each of the values to a threshold.

22. The method of claim 18, wherein said operating on the block of input bits includes repeating each bit of said block of input bits q times, where q is an integer greater than one.

23. The method of claim 18, wherein said operating on the block of input bits includes operating on subblocks of said block of input bits with corresponding subcodes.

24. The method of claim 18, wherein said operating on said outer encoded bits also includes:
performing a middle encoding on said interleaved bits according to a second rate-1, convolutional code; and
interleaving the middle encoded bits to generate the intermediate bits.

25. The method of claim 18, wherein said performing said iterative decoding algorithm includes repeatedly computing messages and passing said messages between nodes in a Tanner graph representation of said structure, wherein said information characterizing relationships between the variables includes said Tanner graph representation.

26. The method of claim 25, wherein the messages are log likelihood ratios.

27. A method comprising:
a first encoder performing an outer encoding on a block of input bits to produce outer encoded bits, wherein said outer encoding has a rate less than one;
an intermediate device operating on said outer encoded bits to generate intermediate bits, wherein said operating on said outer encoded bits includes interleaving the outer encoded bits; and
a second encoder performing an inner encoding on said intermediate bits, wherein the inner encoding is performed according to a first rate-1 convolutional code having a transfer equal to $1/(1+D+D^2)$.

28. The method of claim 27, wherein said performing the outer encoding includes repeating each bit of said block of input bits q times, where q is an integer greater than one.

29. The method of claim 27, wherein said operating on said outer encoded bits also includes:
performing a first encoding on bits resulting from said interleaving of the outer encoded bits to generate first encoded bits according to a second rate-1 convolutional code; and
interleaving the first encoded bits to generate the intermediate bits.

30. The method of claim 27, wherein said performing the outer encoding includes operating on subblocks of said block of input bits with corresponding subcodes.

31. The method of claim 30, wherein the subcodes are truncated convolutional codes.

32. A system comprising:
an outer encoder having a rate less than one and configured to generate outer encoded bits by operating on a block of input bits;
an interleaver subsystem configured to operate on said outer encoded bits to generate intermediate bits, wherein said operating on said outer encoded bits includes interleaving the outer encoded bits; and
an inner encoder configured to operate on the intermediate bits according to a first rate-1 convolutional code having a transfer function equal to $1/(1+D+D^2)$.

33. The system of claim 32, wherein said operating on the block of input bits includes repeating each bit of the block of input bits q times, where q is an integer greater than one.

34. The system of claim 32, wherein the inner encoder includes one or more XOR gates and two delay elements.

35. The system of claim 32, wherein the interleaver subsystem includes a first interleaver, a first encoder and a second interleaver, wherein the first interleaver is configured to perform said interleaving of the outer encoded bits to generate interleaved bits, wherein the first encoder is configured to perform an encoding on said interleaved bits to generate first encoded bits according to a second rate-1 convolutional code, wherein the second interleaver is configured to perform an interleaving on said first encoded bits.

36. The system of claim 32, wherein said operating on the block of input bits includes operating on subblocks of the block of input bits with corresponding subcodes.

37. The system of claim 36, wherein the subcodes are truncated convolutional codes.

38. A method for decoding information, the method comprising:
a device receiving input information from a channel, wherein the input information corresponds to encoded output bits generated by an encoder, wherein the encoder has a structure including:
an outer encoder with a rate less than one configured to operate on a block of input bits;
a subsystem configured to operate on said outer encoded bits in order to generate intermediate bits, wherein said operating on said outer encoded bits includes interleaving the outer encoded bits; and
an inner encoder configured to operate on the intermediate bits according to a first rate-1 convolutional code having transfer function $1/(1+D+D^2)$ in order to produce said encoded output bits;
the device performing an iterative decoding algorithm to determine soft output information using the received input information, wherein said iterative decoding algorithm relies on information characterizing relationships between variables including first variables that correspond to the input bits and second variables that corresponding to the encoded output bits, wherein said relationships are determined at least in part by said structure of the encoder;
the device determining estimates of the input bits based on the soft output information.

39. The method of claim 38, wherein said performing said iterative decoding algorithm includes terminating said iterative decoding algorithm when a termination condition is achieved.

40. The method of claim 38, wherein said performing said iterative decoding algorithm includes repeatedly computing messages and passing said messages between nodes in a Tanner graph representation of said structure, wherein said information characterizing relationships between the variables includes said Tanner graph representation.

41. The method of claim 38, wherein the input information includes samples of an analog signal, wherein the soft output information includes a plurality of values, wherein said determining estimates of the input bits based on the soft output information includes comparing each of the values to a threshold.

42. The method of claim 38, wherein said operating on the block of input bits includes repeating each of the input bits of said block q times, where q is an integer greater than one.

43. The method of claim 38, wherein said operating on the block of input bits includes operating on subblocks of said block with corresponding sub codes.

44. The method of claim 38, wherein said operating on said outer encoded bits also includes:
  performing a middle encoding on said interleaved bits according to a second rate-1 convolutional code; and
  interleaving the middle encoded bits to generate the intermediate bits.

* * * * *

UNITED STATES PATENT AND TRADEMARK OFFICE
CERTIFICATE OF CORRECTION

PATENT NO. : 7,716,552 B2
APPLICATION NO. : 11/429083
DATED : May 11, 2010
INVENTOR(S) : Dariush Divsalar et al.

It is certified that error appears in the above-identified patent and that said Letters Patent is hereby corrected as shown below:

<u>Column 8</u>

Line 66, please delete "transfer function equal to 1/(1D)" and substitute -- a transfer function equal to 1/(1+D) --.

Signed and Sealed this

Thirty-first Day of August, 2010

David J. Kappos
*Director of the United States Patent and Trademark Office*